(12) United States Patent
Prinz et al.

(10) Patent No.: US 7,439,134 B1
(45) Date of Patent: Oct. 21, 2008

(54) METHOD FOR PROCESS INTEGRATION OF NON-VOLATILE MEMORY CELL TRANSISTORS WITH TRANSISTORS OF ANOTHER TYPE

(75) Inventors: Erwin J. Prinz, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 20 days.

(21) Appl. No.: 11/738,003

(22) Filed: Apr. 20, 2007

(51) Int. Cl.
*H01L 21/336* (2006.01)

(52) U.S. Cl. .................. 438/258; 438/257; 438/262; 438/264; 438/283; 438/288; 257/500; 257/501; 257/502; 257/E21.422; 257/E27.064; 257/314; 257/315; 257/E21.688; 257/E21.687; 257/E29.129

(58) Field of Classification Search .......... 438/257, 438/258, 262, 264; 257/500, 501, E27.064, 257/314, 315, E21.422, E21.688, E21.687, 257/E29.129, E29.3, 502
See application file for complete search history.

(56) References Cited

U.S. PATENT DOCUMENTS

| | | | | |
|---|---|---|---|---|
| 4,651,406 | A * | 3/1987 | Shimizu et al. ............ 438/275 |
| RE34,535 | E * | 2/1994 | Paterson et al. ........ 365/185.01 |
| 5,620,920 | A * | 4/1997 | Wilmsmeyer ............... 438/227 |
| 5,723,355 | A * | 3/1998 | Chang et al. ............... 438/275 |
| 5,888,869 | A * | 3/1999 | Cho et al. .................. 438/258 |
| 6,159,799 | A * | 12/2000 | Yu ............................. 438/257 |
| 6,162,683 | A * | 12/2000 | Chen ......................... 438/258 |
| 6,165,846 | A * | 12/2000 | Carns et al. ................. 438/264 |
| 6,399,443 | B1 * | 6/2002 | Chwa et al. ................. 438/258 |
| 6,455,374 | B1 * | 9/2002 | Lee et al. .................... 438/257 |
| 6,483,749 | B1 * | 11/2002 | Choi et al. ............. 365/185.18 |
| 6,503,800 | B2 * | 1/2003 | Toda et al. .................. 438/279 |
| 6,534,363 | B2 * | 3/2003 | Kim .......................... 438/258 |
| 6,569,742 | B1 * | 5/2003 | Taniguchi et al. ........... 438/303 |
| 6,689,653 | B1 * | 2/2004 | Seah et al. .................. 438/201 |
| 6,900,097 | B2 * | 5/2005 | Chen et al. ................. 438/257 |
| 7,179,709 | B2 * | 2/2007 | Kim et al. .................. 438/257 |
| 7,241,662 | B2 * | 7/2007 | Wolstenholme et al. ..... 438/275 |

(Continued)

OTHER PUBLICATIONS

Kuo et al; "A 32-bit RISC Microcontroller with 448K Bytes of Embedded Flash Memory"; 1998 International Non-Volatile Memory Technology Conference.

*Primary Examiner*—Matthew S. Smith
*Assistant Examiner*—Ankush K Singal
(74) *Attorney, Agent, or Firm*—Daniel D. Hill; Robert L. King

(57) ABSTRACT

A method for making a semiconductor device having non-volatile memory cell transistors and transistors of another type is provided. In the method, a substrate is provided having an NVM region, a high voltage (HV) region, and a low voltage (LV) region. The method includes forming a gate dielectric layer on the HV and LV regions. A tunnel oxide layer is formed over the substrate in the NVM region and the gate dielectric in the HV and LV regions. A first polysilicon layer is formed over the tunnel dielectric layer and gate dielectric layer. The first polysilicon layer is patterned to form NVM floating gates. An ONO layer is formed over the first polysilicon layer. A single etch removal step is used to form gates for the HV transistors from the first polysilicon layer while removing the first polysilicon layer from the LV region.

20 Claims, 5 Drawing Sheets

U.S. PATENT DOCUMENTS

| | | | |
|---|---|---|---|
| 7,262,102 B2 * | 8/2007 | Wolstenholme et al. | 438/275 |
| 2001/0045590 A1 * | 11/2001 | Kobayashi | 257/298 |
| 2003/0032244 A1 * | 2/2003 | Peschiaroli et al. | 438/257 |
| 2004/0169250 A1 * | 9/2004 | Kobayashi | 257/510 |
| 2005/0079662 A1 * | 4/2005 | Miki | 438/200 |
| 2005/0221558 A1 * | 10/2005 | Lee | 438/257 |
| 2005/0230741 A1 * | 10/2005 | Tsunoda et al. | 257/315 |
| 2006/0019446 A1 * | 1/2006 | Yang | 438/257 |
| 2006/0035432 A1 * | 2/2006 | Kim et al. | 438/257 |
| 2006/0110942 A1 * | 5/2006 | Lee | 438/786 |
| 2007/0184606 A1 * | 8/2007 | You et al. | 438/211 |
| 2007/0290252 A1 * | 12/2007 | Koo et al. | 257/315 |
| 2008/0014701 A1 * | 1/2008 | Tsunoda et al. | 438/258 |
| 2008/0036008 A1 * | 2/2008 | Hirase et al. | 257/369 |

* cited by examiner

METHOD FOR PROCESS INTEGRATION OF NON-VOLATILE MEMORY CELL TRANSISTORS WITH TRANSISTORS OF ANOTHER TYPE

BACKGROUND

1. Field

This disclosure relates generally to semiconductor devices, and more specifically, to a method for process integration of non-volatile memory (NVM) cell transistors with transistors of another type.

2. Related Art

Many semiconductor devices include, or embed, non-volatile memory transistors with other transistor types on the same integrated circuit (IC). The manufacturing processes for the different transistor types may not be the same, requiring that the processes be integrated. For example, to integrate NVM with, for example, CMOS (complementary metal oxide semiconductor), the CMOS process may be modified to include the process steps necessary to fabricate the NVM memory cell and the supporting devices such as peripheral high voltage (HV) transistors and low voltage (LV) transistors.

In most embedded NVMs, information is stored as charge on a "floating gate" which is completely surrounded by insulators, and which affects the threshold voltage of a transistor such that one bit of information corresponds to its on- and off-state. Charge is moved into and out of the floating gate by physical mechanisms such as hot-carrier injection or tunneling. Either method requires voltages higher than the core supply voltage. Using contemporary technology, a potential of approximately ±9 volts is required. To support these elevated voltages, the peripheral HV transistors are built with thicker-than-nominal gate oxides, and charge pump circuits are employed to generate the high voltages from the chip supply voltage.

Flash NVM is commonly embedded in, for example, system-on-a-chip (SoC) integrated circuits having both HV and LV transistors. In a semiconductor fabrication process for forming the embedded flash memory on an IC with HV transistors using two polysilicon layers, a first polysilicon layer may be used to form the non-volatile memory cell floating gates and the HV transistor gates. Or the first polysilicon layer may be used to form the memory cell floating gates while a second polysilicon layer is patterned to produce HV transistor gates. Additionally, the second polysilicon layer may also be used to form the LV transistor gates. The flash NVM may have an ONO (oxide-nitride-oxide) insulating layer between the floating gate and the control gate. The ONO layer is removed from the HV transistor gates. However, in some semiconductor fabrication processes undesirable ONO sidewall spacers may be formed on the sides of the HV transistor gates that are not easily removed. The presence of the ONO spacers may cause reliability issues with the HV transistors because charge traps in the nitride may cause unstable operation. An additional isotropic dry etch or an isotropic wet BOE (buffered oxide etchant) etch can be used to remove the ONO spacers. However, using an etch process to remove the ONO spacers adds additional process steps that increase manufacturing time and expense. Also, the unwanted ONO spacers on the sidewall can lift off during further processing, raising the level of contamination and defectivity for the semiconductor device.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, in one embodiment, the present invention provides a method for making a semiconductor device having non-volatile memory cell transistors, high voltage CMOS transistors, low voltage CMOS transistors, and having two polysilicon layers, where the non-volatile memory cell floating gates and the HV transistors are formed on a substrate using a first, or lower, polysilicon layer, and the LV transistors are formed using a second, or upper, polysilicon layer. The method includes forming a gate dielectric layer on the HV and LV regions. A tunnel oxide layer is formed under the substrate in the NVM region and over the gate dielectric in the HV and LV regions. A first polysilicon layer is formed over the tunnel dielectric layer and gate dielectric layer. The first polysilicon layer is patterned to form NVM floating gates. An ONO layer is formed over the first polysilicon layer. A single etch removal step is used to form one or more gates for the HV transistors from the first polysilicon layer while completely removing the first polysilicon layer in the LV region. By forming the ONO layer before patterning the HV region gates, unwanted ONO sidewall spacers are not formed, thus eliminating the need for an additional etch process step and reducing the possibility of unstable HV transistors. Also, removing the unwanted ONO spacers eliminates the problem with ONO spacers on the sidewall lifting off during further processing.

Figure 1:
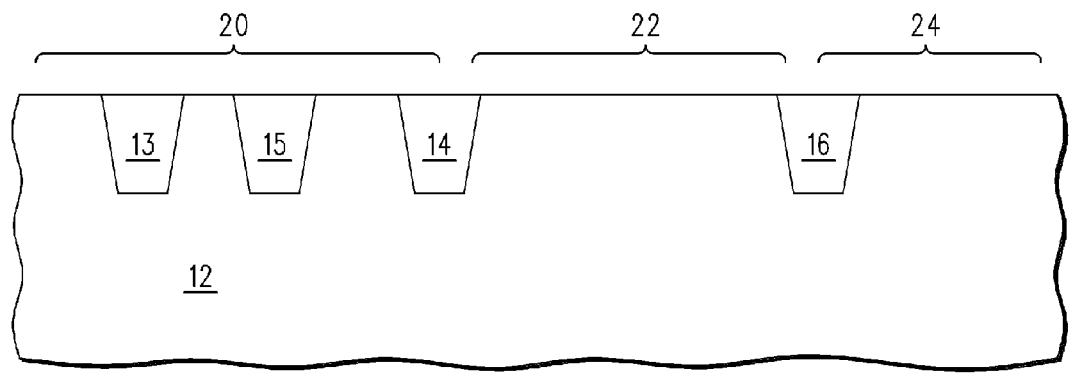
FIG. 1 through FIG. 11 illustrate cross sectional views of steps for making a semiconductor device in accordance with an embodiment of the present invention.

FIGS. 1-11 illustrate cross-sectional views of steps for making a semiconductor device 10 in accordance with an embodiment. FIG. 1 illustrates a cross section of semiconductor device 10 after a conventional shallow trench isolation (STI) process is used to partition, or divide, a substrate 12 of semiconductor device 10 into a non-volatile region 20, a high voltage transistor region 22, and a low voltage transistor region 24. Trench 14 electrically separates region 20 from region 22, and trench 16 electrically separates region 22 from region 24. In other embodiments, the number of regions separated by STI may be different. Trenches 13 and 15 are formed at the same time as trenches 14 and 16 and electrically separate active area regions under adjacent bit cell floating gates. Non-volatile source/drain regions, when formed, will be perpendicular to the present view and cannot be seen in the drawings. Trenches 13-16 are filled with a conventional trench fill material. In the illustrated embodiment, substrate 12 is a silicon substrate. In other embodiments, substrate 12 can be any semiconductor material or combinations of materials, such as gallium arsenide, silicon germanium, silicon-on-insulator (SOI), silicon, monocrystalline silicon, the like, and combinations of the above. Also, well regions (not shown) may be formed in the various regions.

Figure 2:
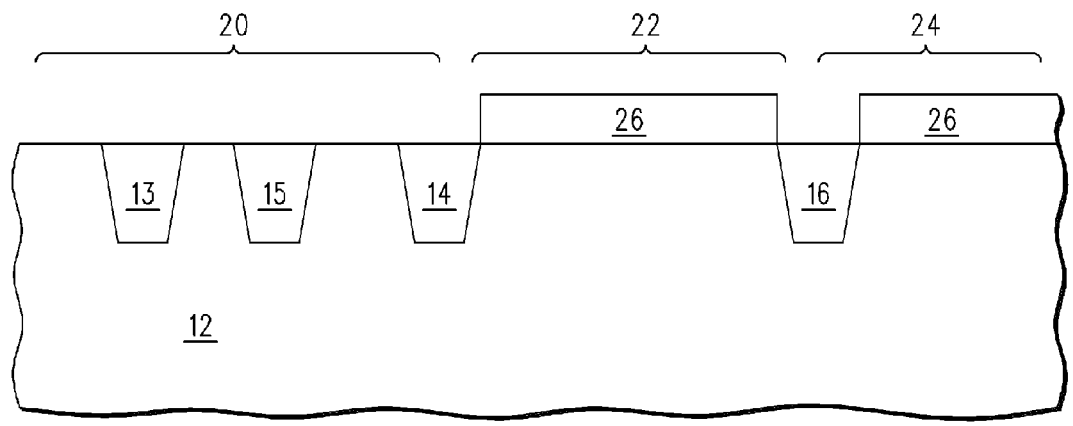

FIG. 2 illustrates a cross section of semiconductor device 10 after a high voltage gate oxide, or dielectric, layer 26 is grown on a surface of substrate 12 and then removed from non-volatile memory cell region 20 using a negative photomask and conventional wet etch process in one embodiment. In another embodiment a BOE etch or dry etch process may be used.

Figure 3:
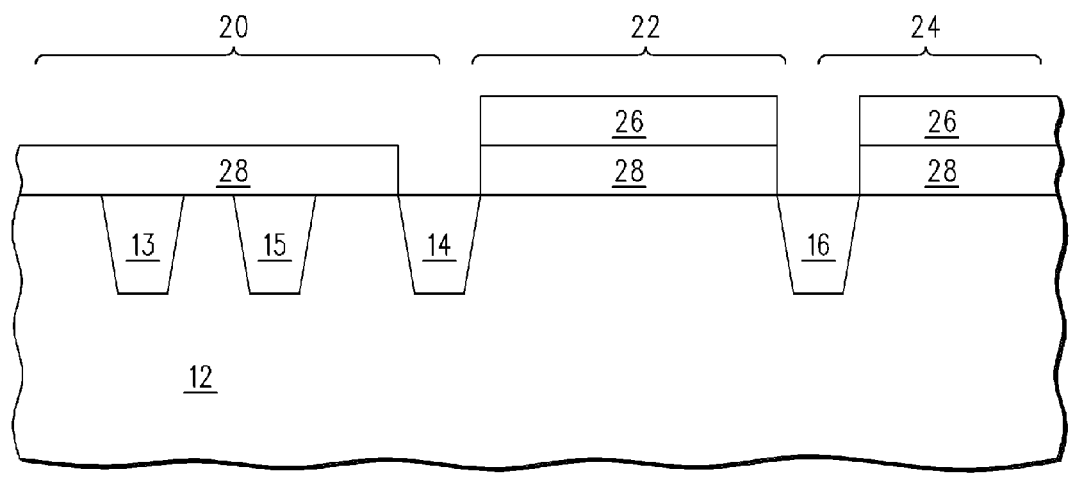

FIG. 3 illustrates a cross section of semiconductor device 10 after a tunnel oxide layer 28 is grown on a surface of the non-volatile memory cell region 20, and on a surface of regions 22 and 24 underlying oxide layer 26. In another embodiment, the tunnel oxide can be a deposited dielectric over oxide layer 26, rather than being grown under oxide layer 26 at the interface between oxide and silicon.

Figure 4:
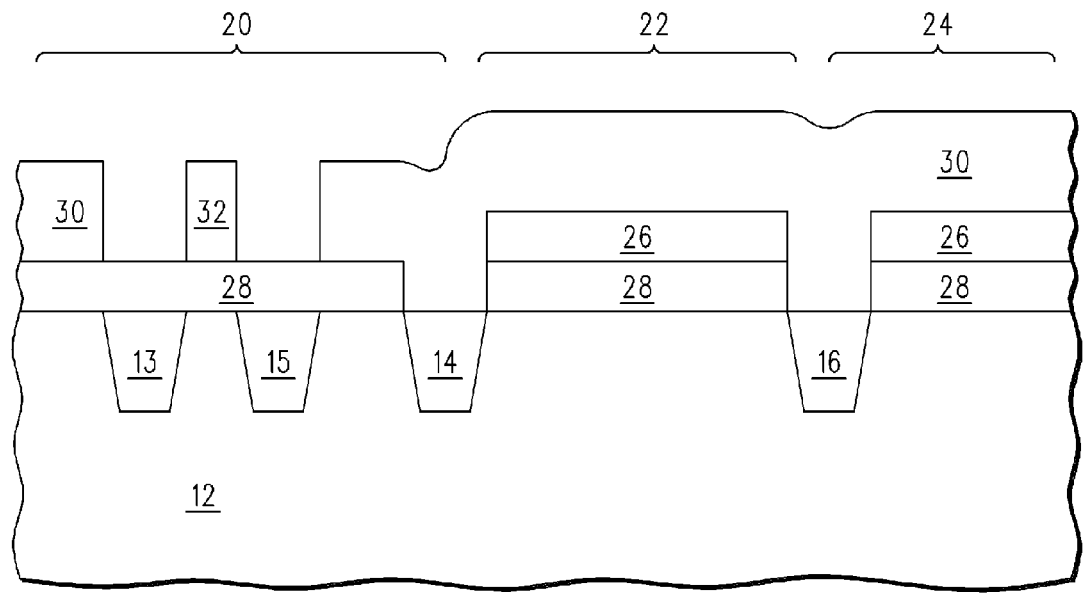

FIG. 4 illustrates a cross section of semiconductor device 10 after a first polysilicon layer 30 is deposited and patterned in the non-volatile region 20 to form non-volatile memory cell floating gate structures over tunnel oxide 28, such as for example, floating gate structure 32. In the illustrated embodiment, polysilicon layer 30 is patterned using a negative photolithographic mask (not shown) and is about 1000-2000 Angstroms thick. Note that in other embodiments, the floating gate structure 32 may comprise a metal such as aluminum or copper, as well as silicided poly and a combination of metal and silicided poly stacks.

Figure 5:
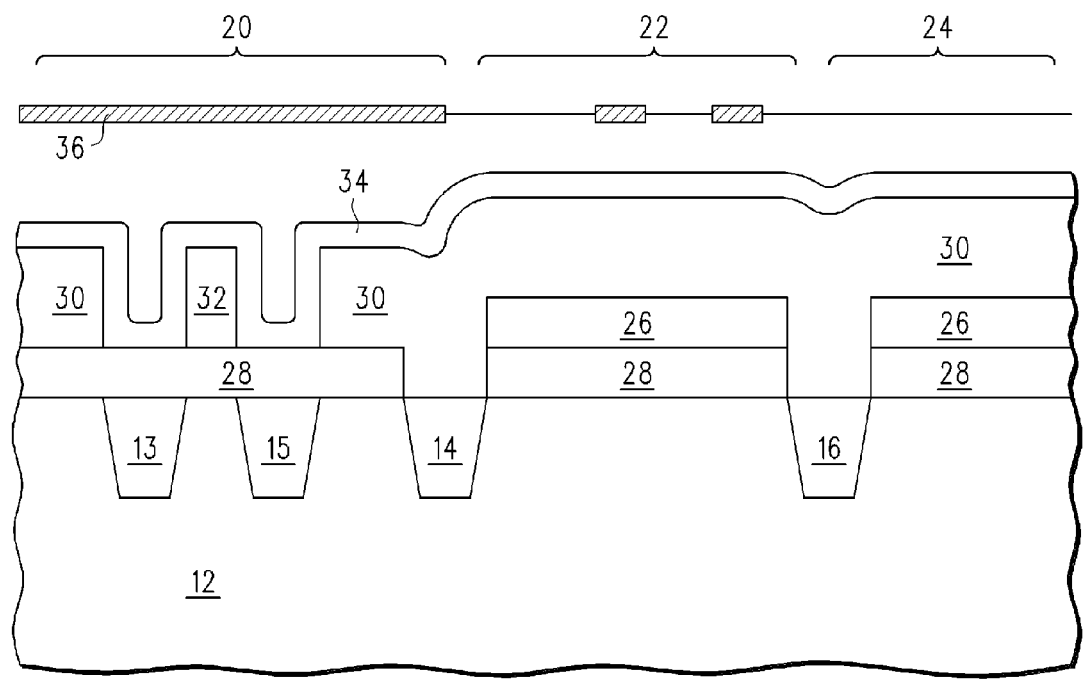

FIG. 5 illustrates a cross section of semiconductor device 10 after a multiple layer insulating layer 34 is formed over semiconductor device 10. The multiple layer insulating layer 34 has at least one layer that stores charge. In the illustrated embodiment, the multiple layer insulating layer 34 comprises a conventional ONO (oxide-nitride-oxide) stack. The oxide layers of stack 34 are about 50 Angstroms thick and the nitride layer is about 50 to 100 Angstroms thick. A positive photolithographic mask 36 is illustrated over the semiconductor device 10. Note that a positive photoresist (not shown) is also used. The positive photomask 36 is used to selectively etch ONO stack 34, first polysilicon layer 30, and insulating layers 26 and 28 to form control gates in HV region 22 and to remove layers 30, 26, and 28 in LV region 24. Note that in other embodiments, insulating layer 34 may comprise only one layer. Also, in other embodiments, a negative photolithographic mask may be used instead of positive photomask 36.

Figure 6:
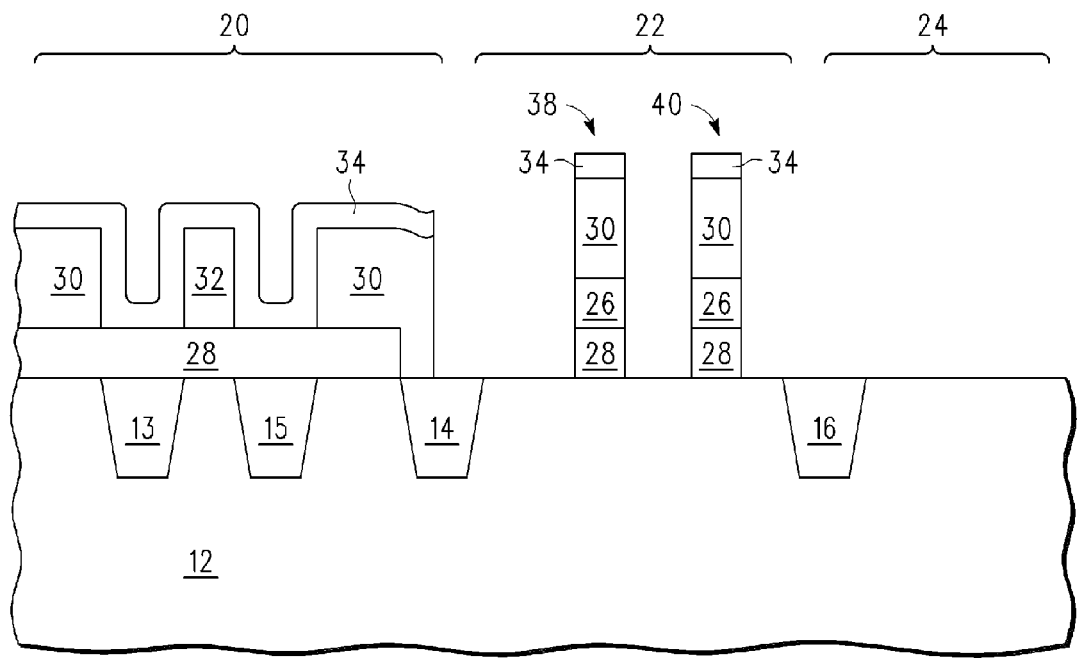

FIG. 6 illustrates a cross section of semiconductor device 10 after representative HV transistor gates 38 and 40 are formed in region 22 using the photomask 36 of FIG. 5. Gates 38 and 40 are formed by etching oxide layer 28, oxide layer 26, polysilicon layer 30, and ONO layer 34 in the HV transistor region 22 not protected by the photomask 36. Tunnel oxide layer 28, oxide layer 26, polysilicon layer 30, and ONO layer 34 are removed from all of LV transistor region 24 at the same time gates 38 and 40 are formed. In the illustrated embodiment, a conventional anisotropic dry etch is used. In other embodiments, another type of etch process may be used, such as a wet etch process. The ONO layer 34 remains on the top of gates 38 and 40 and will be removed later. Note that because the ONO layer 34 is formed before the HV transistor gates are patterned, no unwanted ONO sidewall spacers are formed on the sides of the NV transistor gates. Also, an additional etch step is avoided to remove unwanted ONO sidewall spacers. Oxide layers 26 and 28 together form the gate dielectric layer for the HV transistors of region 22. Note that generally, in the illustrated embodiment, the HV transistors in region 22 are distinguished from LV transistors in region 24 by the thickness of their gate dielectrics. That is, HV transistors have a thicker gate dielectric than LV transistors to permit the higher voltage capability.

Figure 7:
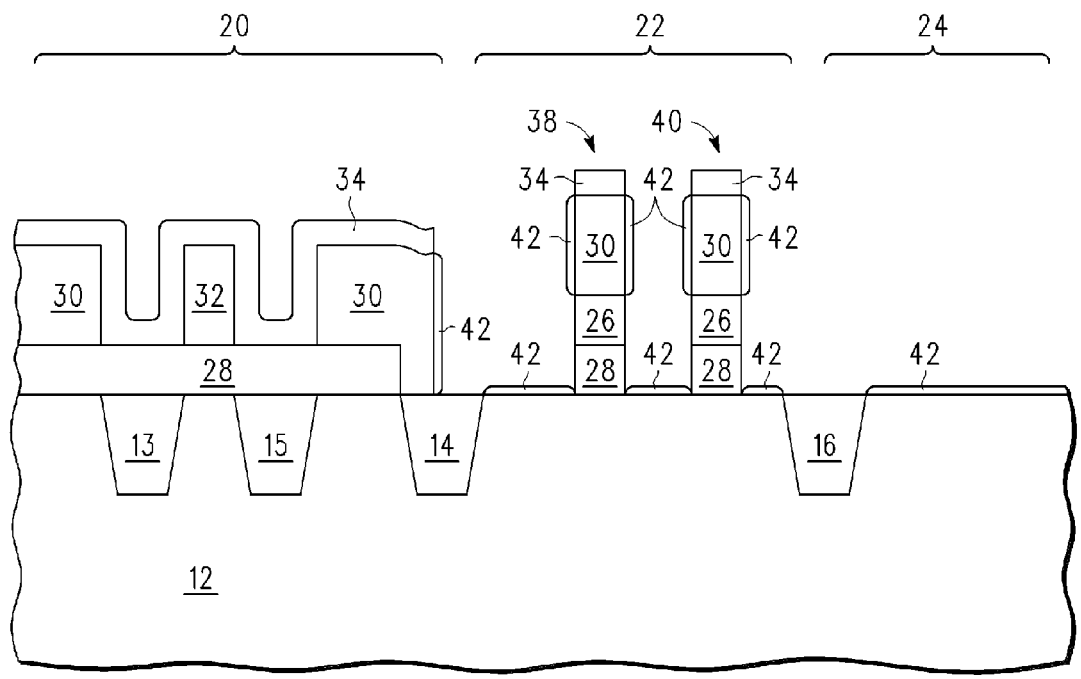

FIG. 7 illustrates a cross section of semiconductor device 10 after a dielectric layer 42 is grown. Dielectric layer 42 is grown on all of the exposed silicon surface areas of polysilicon layer 30, including the sides of transistor gates 38 and 40, and the surface of substrate 12 as illustrated. Dielectric layer 42 is a gate dielectric for transistors in LV region 24. In other embodiments, the dielectric layer 42 may be deposited instead of grown.

Figure 8:
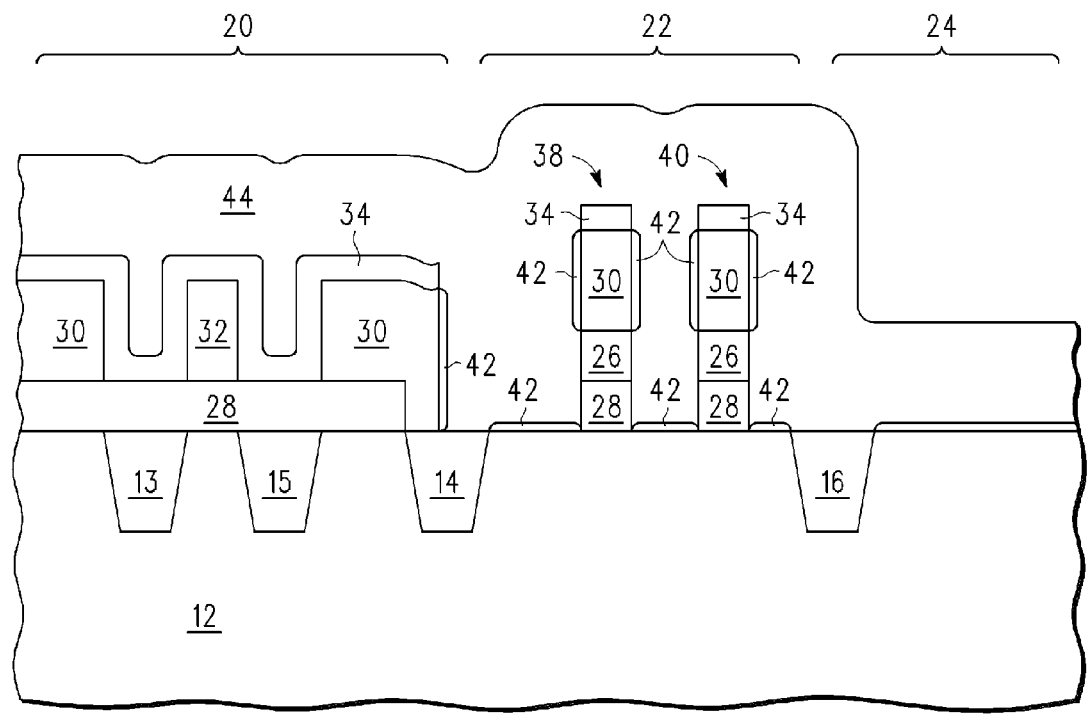

FIG. 8 illustrates a cross section of semiconductor device 10 after a second polysilicon layer 44 is deposited over semiconductor device 10. In the illustrated embodiment, polysilicon layer 44 is between 1000 and 1500 Angstroms thick is used to provide control gates for the NVM transistors of region 20 and gate electrodes for the LV transistors of region 24.

Figure 9:
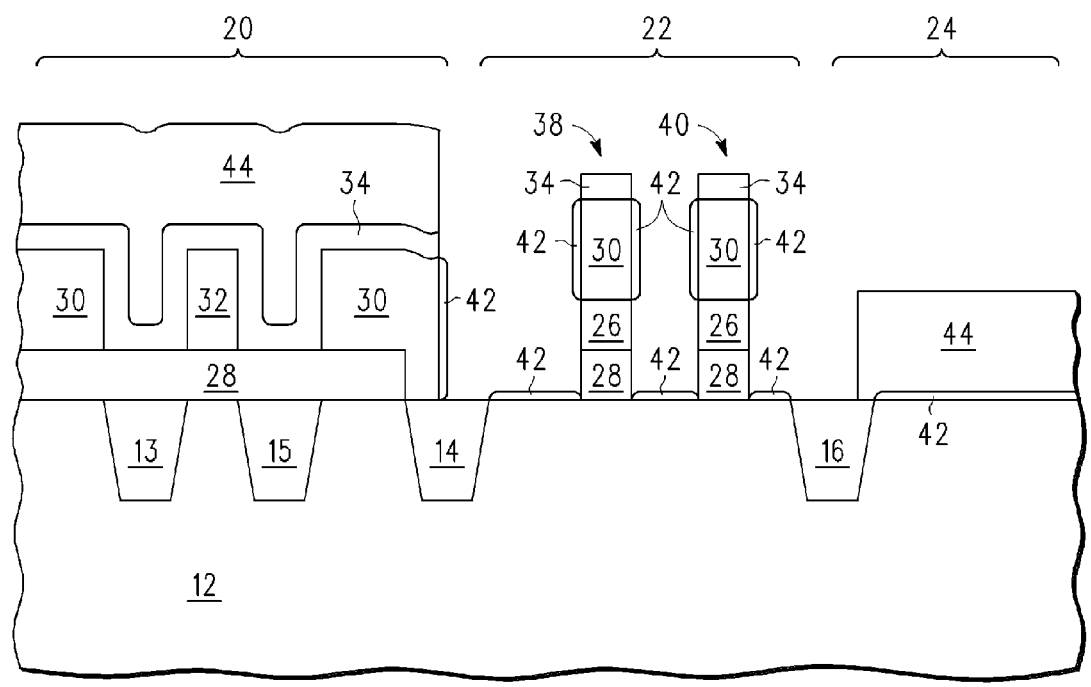

FIG. 9 illustrates a cross section of semiconductor device 10 after polysilicon layer 44 is patterned and removed from HV region 22. A negative photolithographic mask is used to preserve the gates 38 and 40 during a conventional polysilicon etch process.

Figure 10:
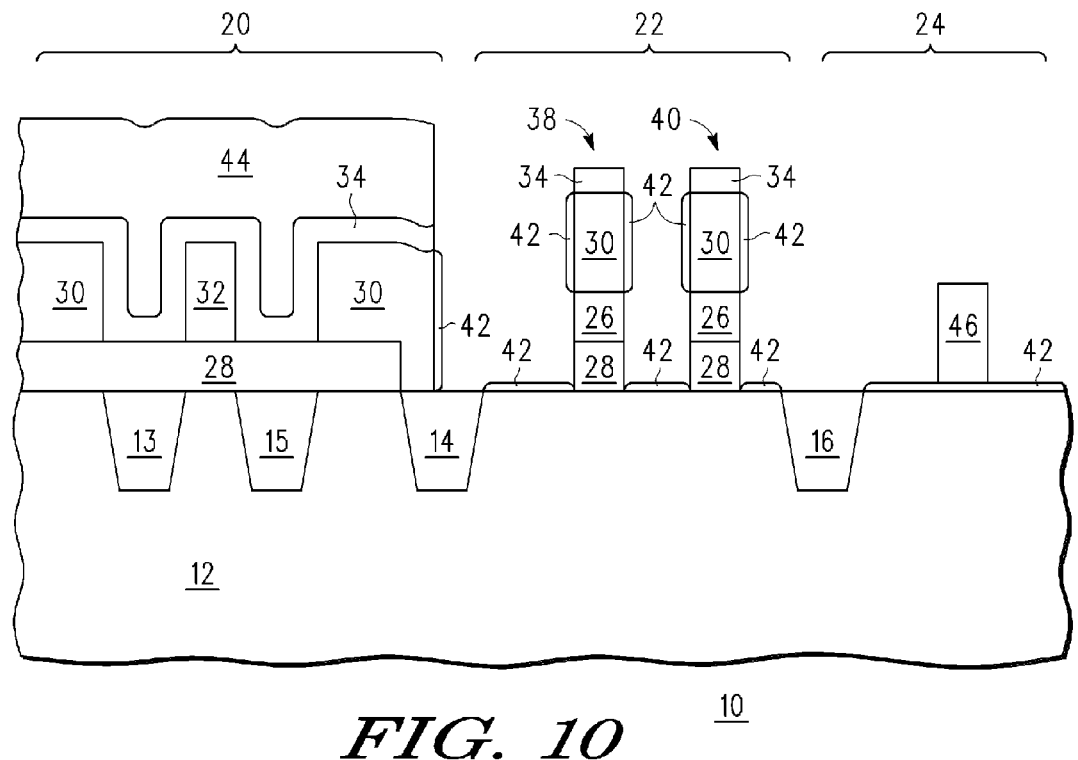

FIG. 10 illustrates a cross section of semiconductor device 10 after second polysilicon layer 44 is patterned to produce LV transistor gates in LV region 24, such as for example, representative LV transistor gate 46.

Figure 11:
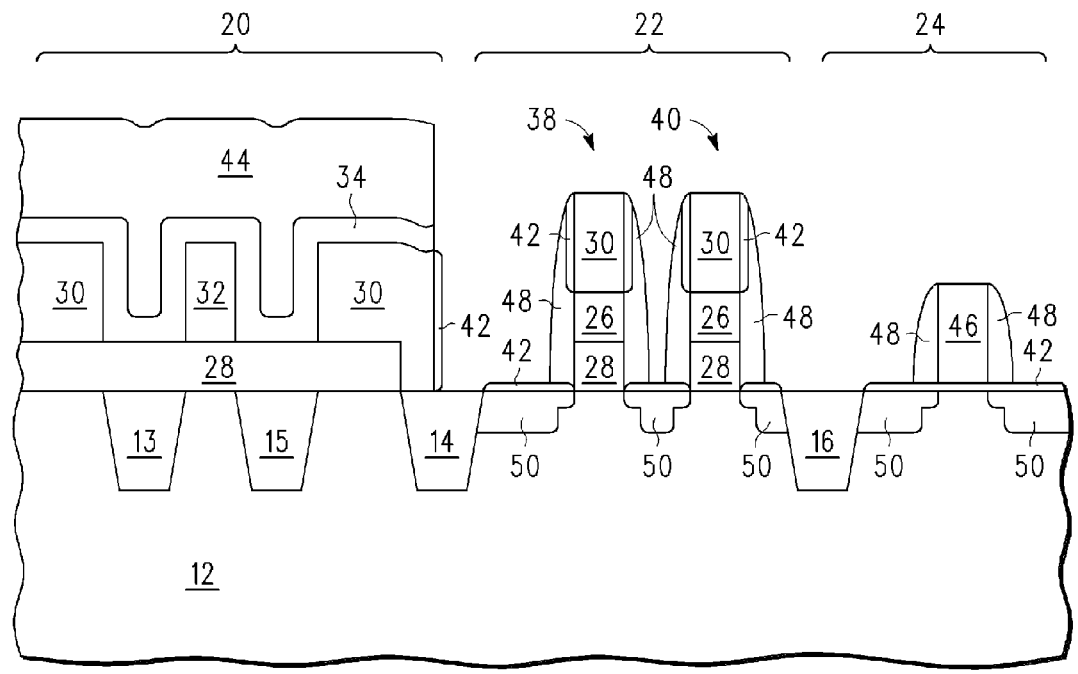

FIG. 11 illustrates a cross section of semiconductor device 10 after source/drain regions 50 and sidewall spacers 48 are formed in HV region 22 and LV region 24 using standard semiconductor processing techniques. For convenience of illustration, only a single FET (field effect transistor) is shown in region 24 of the drawings. For the same reason, only one NVM transistor is shown and two HV transistors are shown. In an actual implementation, there may be many of each type of transistor as well as multiple types of LV transistors with different dielectric oxide thicknesses and implants.

By now it should be appreciated that there has been provided, a process integration that results in low voltage transistors using the second polysilicon layer, high voltage transistors using the first polysilicon layer, and in which the high voltage transistors sidewalls have not been exposed to ONO deposition, preserving their integrity.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:

providing a substrate having a first region for formation of at least one nonvolatile memory cell transistor, a second region that is electrically separated from the first region and a third region that is electrically separated from the first and second regions, the second region being for formation of at least one transistor of higher voltage capability than at least one transistor of the third region;

forming a layer of transistor gate dielectric overlying the second region;

forming a tunnel dielectric layer overlying the first region, the second region and the third region;

forming a first polysilicon layer overlying the tunnel dielectric layer and the layer of transistor gate dielectric;

patterning the first polysilicon layer to form at least one memory cell gate overlying the first region;

depositing a multiple layer dielectric overlying the first polysilicon layer and exposed portions of the tunnel dielectric layer, the multiple layer dielectric having at least one layer that stores electrical charge;

using a same mask in a same etch removal step to form one or more control electrodes in the second region from the first polysilicon layer while substantially removing the first polysilicon layer overlying the third region; and completing formation of the at least one nonvolatile memory cell in the first region, the at least one transistor in the second region and the at least one transistor in the third region, the at least one transistor in the second region having a thicker control electrode oxide than the at least one transistor in the third region to permit the higher voltage capability.

2. The method of claim 1 further comprising:

removing the multiple layer dielectric from overlying the third region with said etch removal step.

3. The method of claim 1 further comprising:

implementing the multiple layer dielectric as an oxide-nitride-oxide (ONO) dielectric layer.

4. The method of claim 1 wherein the completing formation further comprises:

forming a gate dielectric layer overlying the third region of the substrate;

forming a second polysilicon layer overlying the gate dielectric layer;

patterning the second polysilicon layer to remove the second polysilicon layer from above the second region and to form a control electrode of the at least one transistor of the third region;

forming sidewall spacers adjacent the control electrode of the at least one transistor of the third region and adjacent the one or more control electrodes overlying the second region; and forming source and drain diffusion regions within the substrate for the at least one nonvolatile memory in the first region, the at least one transistor in the second region and the at least one transistor in the third region.

5. The method of claim 4 wherein the patterning of the second polysilicon layer is implemented using a negative photolithographic mask.

6. The method of claim 1 wherein the patterning of the first polysilicon layer is implemented using a negative photolithographic mask.

7. A method comprising:

providing a substrate having a first region for formation of at least one nonvolatile memory cell transistor, a second region that is electrically separated from the first region and a third region that is electrically separated from the first and second regions, the second region being for formation of at least one transistor of higher voltage capability than at least one transistor of the third region;

forming a layer of transistor gate dielectric overlying the second region and the third region, but not the first region;

forming a tunnel dielectric layer overlying the first region, the second region and the third region, the tunnel dielectric layer underlying the layer of transistor gate dielectric;

forming a conductive layer overlying the tunnel dielectric layer and the layer of transistor gate dielectric;

patterning the conductive layer to form at least one memory cell gate overlying the first region;

depositing a multiple layer dielectric overlying the conductive layer, the multiple layer dielectric having at least one layer that stores electrical charge;

using a same mask in a same etch removal step to form one or more control electrodes in the second region from the conductive layer while completely removing the conductive layer overlying the third region; and completing formation of the at least one nonvolatile memory cell in the first region, the at least one transistor in the second region and the at least one transistor in the third region, the at least one transistor in the second region having a thicker control electrode oxide than the at least one transistor in the third region to permit the higher voltage capability.

8. The method of claim 7 further comprising forming the conductive layer as a metal layer.

9. The method of claim 7 further comprising forming the conductive layer as a polysilicon layer.

10. The method of claim 7 further comprising forming the multiple layer dielectric as a first layer of oxide underlying a layer of nitride, the layer of nitride underlying a second layer of oxide.

11. The method of claim 7 wherein the completing formation of the at least one nonvolatile memory cell in the first region, the at least one transistor in the second region and the at least one transistor in the third region further comprises:

forming a gate dielectric layer overlying the third region of the substrate;

forming a second conductive layer overlying the gate dielectric layer;

patterning the second conductive layer to remove the second conductive layer from above the second region and to form a control electrode of the at least one transistor of the third region;

forming sidewall spacers adjacent the control electrode of the at least one transistor of the third region and adjacent the one or more control electrodes overlying the second region; and forming source and drain diffusion regions within the substrate for the at least one nonvolatile memory in the first region, for the at least one transistor in the second region and for the at least one transistor in the third region.

12. The method of claim 7 further comprising forming the second conductive layer overlying the multiple layer dielectric used for the at least one nonvolatile memory cell transistor.

13. The method of claim 7 further comprising using a positive mask as the same mask.

14. A method comprising:

dividing a semiconductor device into a first area for at least one memory cell transistor, a second area and a third area, the second area being for formation of transistors of higher voltage capability than transistors of the third area by having thicker control electrode thicknesses;

forming a dielectric overlying a substrate, the dielectric being thicker in the second area and the third area than in the first area;

forming a first polysilicon layer overlying the dielectric and patterning the first polysilicon layer in the first area to form a gate of the memory cell transistor;

depositing a dielectric layer overlying the semiconductor device, the dielectric layer having a charge storage property;

using a same mask to form one or more transistor gates in the second area by selective etching of the first polysilicon layer to substantially remove the first polysilicon layer from the third area; and completing formation of the at least one memory cell transistor in the first area, the transistors in the second area and the transistors in the third area, the transistors in the second area having a thicker control electrode oxide than the transistors in the third area to permit the higher voltage capability.

15. The method of claim 14 further comprising:

forming an oxide-nitride-oxide (ONO) dielectric layer as the dielectric layer.

16. The method of claim 14 further comprising:

also removing the dielectric layer from the third area with by said selective etching.

17. The method of claim 14 wherein the completing formation further comprises:

forming a gate dielectric layer overlying the third area of the semiconductor device;

forming a second polysilicon layer overlying the gate dielectric layer;

patterning the second polysilicon layer to remove the second polysilicon layer from the second area and to form a control electrode of at least one transistor of the third area;

forming sidewall spacers adjacent the control electrode of the at least one transistor of the third area and adjacent the one or more transistor gates of the second area; and forming source and drain diffusion regions within a substrate of the semiconductor device for the at least one memory cell transistor in the first are, the at least one transistor of the second area and the at least one transistor of the third area.

18. The method of claim 14 wherein the patterning of the second polysilicon layer is implemented using a negative photolithographic mask.

19. The method of claim 14 further comprising using a positive mask as the same mask.

20. The method of claim 14 wherein the selective etching is an anisotropic dry etch and no etching occurs in the first area during the selective etching.

* * * * *